(12) United States Patent
Marl

(10) Patent No.: US 11,714,928 B2
(45) Date of Patent: Aug. 1, 2023

(54) SYSTEMS AND METHODS FOR A SELF-ADJUSTING NODE WORKSPACE

(71) Applicant: MAXON Computer GmbH, Friedrichsdorf (DE)

(72) Inventor: Björn Dirk Marl, Friedrichsdorf (DE)

(73) Assignee: MAXON COMPUTER GMBH, Friedrichsdorf (DE)

(*) Notice: Subject to any disclaimer, the term of this patent is extended or adjusted under 35 U.S.C. 154(b) by 441 days.

(21) Appl. No.: 16/802,734

(22) Filed: Feb. 27, 2020

(65) Prior Publication Data

US 2021/0271784 A1 Sep. 2, 2021

(51) Int. Cl.
*G06F 30/12* (2020.01)
*G06T 19/20* (2011.01)
*G06F 30/18* (2020.01)

(52) U.S. Cl.
CPC .............. *G06F 30/12* (2020.01); *G06F 30/18* (2020.01); *G06T 19/20* (2013.01)

(58) Field of Classification Search
CPC . G06F 30/12; G06F 30/18; G06F 8/34; G06F 3/0482; G06F 3/04845; G06F 16/29; G06F 3/0481; G06T 19/20; G06T 11/60; G06T 11/206
See application file for complete search history.

(56) References Cited

U.S. PATENT DOCUMENTS

| | | | |
|---|---|---|---|
| 4,730,186 A | 3/1988 | Koga et al. | |
| 4,963,967 A | 10/1990 | Orland et al. | |
| 5,040,081 A | 8/1991 | McCutchen | |
| 5,060,135 A | * 10/1991 | Levine | G06F 3/0488 |
| | | | 715/838 |
| 5,086,495 A | 2/1992 | Gray et al. | |
| 5,485,563 A | * 1/1996 | Fisher | G06T 3/40 |
| | | | 345/668 |
| 5,519,828 A | 5/1996 | Rayner | |

(Continued)

FOREIGN PATENT DOCUMENTS

| | | |
|---|---|---|
| EP | 0916374 A2 | 5/1999 |
| EP | 2230666 A2 | 9/2010 |

(Continued)

OTHER PUBLICATIONS

Shrstha et al., "Synchronization of Multi-Camera Video Recordings Based on Audio", MM '07: Proceedings of the 15th ACM international conference on Multimedia, Sep. 2007, Augsburg, Bavaria, Germany, pp. 545-548, 5 pages. https://doi.org/10.1145/1291233.1291367.

(Continued)

*Primary Examiner* — Charles L Beard
(74) *Attorney, Agent, or Firm* — DLA Piper LLP (US)

(57) ABSTRACT

Systems and methods are disclosed for automatically adjusting a workspace comprising a plurality of nodes for sustained workflow. One method comprises receiving a new node in the workspace and determining that the new node overlaps with one or more nodes. Based on the determination, a set of nodes within a predetermined distance of the overlap may be repositioned, the set of nodes comprising the new node and the one or more nodes. Upon determining that the new node still overlaps with the one or more nodes, the set of nodes may be scaled down until there is no overlap.

21 Claims, 10 Drawing Sheets

(56) References Cited

U.S. PATENT DOCUMENTS

| | | | |
|---|---|---|---|
| 5,555,357 A * | 9/1996 | Fernandes | G06T 11/206 345/441 |
| 5,623,612 A | 4/1997 | Haneda et al. | |
| 5,664,132 A | 9/1997 | Smith | |
| 5,745,113 A * | 4/1998 | Jordan | G06F 3/0481 715/835 |
| 5,828,360 A | 10/1998 | Anderson et al. | |
| 5,933,153 A | 8/1999 | Deering et al. | |
| 5,936,671 A | 8/1999 | Van Beek et al. | |
| 5,973,691 A * | 10/1999 | Servan-Schreiber | G06T 11/206 715/803 |
| 5,982,909 A | 11/1999 | Erdem et al. | |
| 5,986,662 A | 11/1999 | Argiro et al. | |
| 6,108,006 A | 8/2000 | Hoppe | |
| 6,144,378 A | 11/2000 | Lee et al. | |
| 6,259,458 B1 * | 7/2001 | Theisen | G06T 15/00 345/440 |
| 6,373,488 B1 * | 4/2002 | Gasper | G06F 16/972 707/E17.117 |
| 6,389,173 B1 | 5/2002 | Suzuki et al. | |
| 6,448,987 B1 | 9/2002 | Easty et al. | |
| 6,452,875 B1 | 9/2002 | Lee et al. | |
| 6,546,558 B1 * | 4/2003 | Taguchi | G06F 16/40 725/135 |
| 6,549,219 B2 | 4/2003 | Selker | |
| 6,629,065 B1 * | 9/2003 | Gadh | G06T 19/20 703/1 |
| 6,728,682 B2 | 4/2004 | Fasciano | |
| 6,771,263 B1 | 8/2004 | Behrens et al. | |
| 6,839,462 B1 | 1/2005 | Kitney et al. | |
| 6,879,322 B2 * | 4/2005 | Iida | G06T 11/206 345/635 |
| 6,888,916 B2 | 5/2005 | Launay et al. | |
| 6,973,200 B1 | 12/2005 | Tanaka et al. | |
| 6,993,399 B1 | 1/2006 | Covell et al. | |
| 7,290,704 B1 | 11/2007 | Ball et al. | |
| 7,372,472 B1 | 5/2008 | Bordeleau et al. | |
| 7,401,731 B1 | 7/2008 | Pletz et al. | |
| 7,413,113 B1 | 8/2008 | Zhu | |
| 7,423,645 B2 | 9/2008 | Dougherty et al. | |
| 7,439,975 B2 | 10/2008 | Hsu et al. | |
| 7,487,170 B2 | 2/2009 | Stevens | |
| 7,512,886 B1 | 5/2009 | Herberger et al. | |
| 7,584,152 B2 | 9/2009 | Gupta et al. | |
| 7,603,623 B1 | 10/2009 | Lengeling et al. | |
| 7,668,243 B2 | 2/2010 | Ho et al. | |
| 7,692,724 B2 | 4/2010 | Arora et al. | |
| 7,701,445 B2 | 4/2010 | Inokawa et al. | |
| 7,730,429 B2 | 6/2010 | Kruse et al. | |
| 7,770,125 B1 * | 8/2010 | Young | G06F 9/451 715/764 |
| 7,831,521 B1 | 11/2010 | Ball et al. | |
| 7,949,946 B2 * | 5/2011 | Mollicone | G06T 11/60 715/204 |
| 8,103,545 B2 | 1/2012 | Ramer et al. | |
| 8,140,389 B2 | 3/2012 | Altberg et al. | |
| 8,161,396 B2 * | 4/2012 | Barber | G06Q 10/10 715/733 |
| 8,205,148 B1 | 6/2012 | Sharpe et al. | |
| 8,336,770 B2 | 12/2012 | Grillion | |
| 8,345,046 B2 | 1/2013 | Norrby | |
| 8,370,761 B2 * | 2/2013 | Good | G06F 16/353 715/767 |
| 8,375,329 B2 | 2/2013 | Drayton et al. | |
| 8,413,040 B2 * | 4/2013 | O'Dell-Alexander | G06F 40/134 715/764 |
| 8,519,979 B1 * | 8/2013 | Smith | G06F 3/04883 700/83 |
| 8,560,449 B1 | 10/2013 | Sears | |
| 8,601,366 B2 * | 12/2013 | Saltwell | G06F 16/957 715/236 |
| 8,659,621 B1 * | 2/2014 | Stiglitz | G06T 19/20 715/764 |
| 8,667,406 B1 * | 3/2014 | Thakur | G06F 3/0481 715/764 |
| 8,698,806 B2 | 4/2014 | Kunert et al. | |
| 8,793,599 B1 * | 7/2014 | Lajoie | G06F 30/00 715/764 |
| 8,850,335 B2 * | 9/2014 | Eldridge | G06Q 10/06 715/740 |
| 9,035,949 B1 * | 5/2015 | Oberheu | G06T 11/206 345/440 |
| 9,038,001 B2 * | 5/2015 | Jetter | G06F 40/154 715/853 |
| 9,158,508 B2 * | 10/2015 | Eldridge | G06F 8/34 |
| 9,223,488 B1 * | 12/2015 | Lajoie | H04L 41/22 |
| 9,449,647 B2 | 9/2016 | Sharpe et al. | |
| 9,478,033 B1 | 10/2016 | Sharpe et al. | |
| 9,734,608 B2 * | 8/2017 | Grealish | G06T 11/206 |
| 9,740,368 B1 * | 8/2017 | Love | G06F 3/04817 |
| 9,766,787 B2 * | 9/2017 | Danton | G06F 16/29 |
| 9,804,747 B2 * | 10/2017 | Schmitlin | G06F 21/6218 |
| 9,911,211 B1 * | 3/2018 | Damaraju | G06F 16/9024 |
| 10,434,717 B2 | 10/2019 | Boettcher et al. | |
| 11,321,904 B2 * | 5/2022 | Kniemeyer | G06T 19/00 |
| 2002/0094135 A1 | 7/2002 | Caspi et al. | |
| 2002/0122113 A1 | 9/2002 | Foote | |
| 2002/0123938 A1 | 9/2002 | Yu et al. | |
| 2003/0146915 A1 | 8/2003 | Brook et al. | |
| 2003/0160944 A1 | 8/2003 | Foote et al. | |
| 2003/0179234 A1 * | 9/2003 | Nelson | G06F 3/04845 715/764 |
| 2003/0179740 A1 | 9/2003 | Baina et al. | |
| 2004/0049739 A1 * | 3/2004 | McArdle | G06Q 10/06 715/229 |
| 2004/0148159 A1 | 7/2004 | Crockett et al. | |
| 2004/0170392 A1 | 9/2004 | Lu et al. | |
| 2005/0046889 A1 | 3/2005 | Braudaway | |
| 2005/0091599 A1 * | 4/2005 | Yamakado | G06F 40/103 358/1.18 |
| 2005/0162395 A1 | 7/2005 | Unruh | |
| 2005/0165840 A1 | 7/2005 | Pratt et al. | |
| 2005/0192956 A1 * | 9/2005 | Evans | G06F 16/355 707/999.005 |
| 2005/0199714 A1 | 9/2005 | Brandt et al. | |
| 2006/0008247 A1 | 1/2006 | Minami et al. | |
| 2006/0078305 A1 | 4/2006 | Arora et al. | |
| 2006/0098007 A1 | 5/2006 | Rouet et al. | |
| 2006/0121436 A1 * | 6/2006 | Kruse | G06F 3/0481 434/433 |
| 2006/0123445 A1 | 6/2006 | Sullivan et al. | |
| 2006/0150072 A1 | 7/2006 | Salvucci | |
| 2006/0150215 A1 * | 7/2006 | Wroblewski | H04N 21/4312 725/47 |
| 2006/0212704 A1 | 9/2006 | Kirovski et al. | |
| 2006/0290695 A1 | 12/2006 | Salomie | |
| 2007/0002047 A1 | 1/2007 | Desgranges et al. | |
| 2007/0036403 A1 * | 2/2007 | Albertson | G06F 3/04845 382/128 |
| 2007/0075998 A1 | 4/2007 | Cook et al. | |
| 2007/0100773 A1 | 5/2007 | Wallach | |
| 2007/0162844 A1 * | 7/2007 | Woodall | G06F 40/177 715/209 |
| 2007/0189708 A1 | 8/2007 | Lerman et al. | |
| 2007/0230765 A1 | 10/2007 | Wang et al. | |
| 2007/0248321 A1 * | 10/2007 | Hamada | G11B 27/034 |
| 2007/0248322 A1 * | 10/2007 | Hamada | H04N 5/85 386/241 |
| 2007/0256029 A1 | 11/2007 | Maxwell | |
| 2007/0257909 A1 | 11/2007 | Kihslinger | |
| 2008/0005130 A1 | 1/2008 | Logan et al. | |
| 2008/0012859 A1 * | 1/2008 | Saillet | G06T 11/60 345/440 |
| 2008/0021787 A1 | 1/2008 | Mackouse | |
| 2008/0033880 A1 | 2/2008 | Fiebiger et al. | |
| 2008/0079851 A1 | 4/2008 | Stanger et al. | |
| 2008/0082510 A1 | 4/2008 | Wang et al. | |
| 2008/0099552 A1 | 5/2008 | Grillion | |
| 2008/0117204 A1 | 5/2008 | Thom | |

(56) References Cited

U.S. PATENT DOCUMENTS

| | | | |
|---|---|---|---|
| 2008/0150937 A1 | 6/2008 | Lundstrom et al. | |
| 2008/0162577 A1 | 7/2008 | Fukuda et al. | |
| 2008/0177663 A1 | 7/2008 | Gupta et al. | |
| 2008/0256448 A1 | 10/2008 | Bhatt | |
| 2008/0301341 A1 | 12/2008 | Mosek et al. | |
| 2008/0304814 A1* | 12/2008 | Fujii | G11B 19/025 386/334 |
| 2008/0306790 A1 | 12/2008 | Otto et al. | |
| 2008/0313565 A1* | 12/2008 | Albertson | G06T 11/206 715/825 |
| 2009/0034940 A1* | 2/2009 | Hamada | H04N 9/8205 386/341 |
| 2009/0063312 A1 | 3/2009 | Hurst | |
| 2009/0079742 A1* | 3/2009 | Albertson | G06F 8/34 345/441 |
| 2009/0087161 A1 | 4/2009 | Roberts et al. | |
| 2009/0100333 A1* | 4/2009 | Xiao | G06T 11/206 715/252 |
| 2009/0157519 A1 | 6/2009 | Bishop et al. | |
| 2009/0167942 A1 | 7/2009 | Hoogenstraaten et al. | |
| 2009/0171683 A1 | 7/2009 | Hoyos et al. | |
| 2009/0192904 A1 | 7/2009 | Patterson et al. | |
| 2009/0198614 A1 | 8/2009 | De Ruiter et al. | |
| 2009/0199123 A1* | 8/2009 | Albertson | G06F 3/04845 715/772 |
| 2009/0228786 A1* | 9/2009 | Danton | G06T 11/206 715/243 |
| 2009/0231337 A1 | 9/2009 | Carr et al. | |
| 2009/0254864 A1 | 10/2009 | Whittington et al. | |
| 2009/0279453 A1 | 11/2009 | Yeh et al. | |
| 2009/0318800 A1 | 12/2009 | Gundel et al. | |
| 2009/0319948 A1* | 12/2009 | Stannard | G06T 11/206 715/810 |
| 2010/0050083 A1 | 2/2010 | Axen et al. | |
| 2010/0050102 A1* | 2/2010 | Baba | G06F 3/04845 715/765 |
| 2010/0053215 A1* | 3/2010 | Coldicott | G06T 11/206 345/630 |
| 2010/0058161 A1* | 3/2010 | Coldicott | G06T 11/206 715/244 |
| 2010/0058162 A1* | 3/2010 | Coldicott | G06T 11/206 707/E17.024 |
| 2010/0063903 A1 | 3/2010 | Whipple et al. | |
| 2010/0083077 A1* | 4/2010 | Paulsen | G11B 27/34 715/202 |
| 2010/0146393 A1 | 6/2010 | Land et al. | |
| 2010/0153841 A1* | 6/2010 | Haug, III | G06T 11/206 715/244 |
| 2010/0183280 A1 | 7/2010 | Beauregard et al. | |
| 2010/0185985 A1 | 7/2010 | Chmielewski et al. | |
| 2010/0192101 A1 | 7/2010 | Chmielewski et al. | |
| 2010/0192102 A1 | 7/2010 | Chmielewski et al. | |
| 2010/0211860 A1* | 8/2010 | O'Dell-Alexander | G06F 40/134 715/205 |
| 2010/0228669 A1 | 9/2010 | Karim | |
| 2010/0333030 A1 | 12/2010 | Johns | |
| 2011/0161873 A1* | 6/2011 | Murakami | G06F 3/033 715/800 |
| 2011/0169825 A1* | 7/2011 | Ishiyama | H04N 13/183 345/419 |
| 2012/0020585 A1* | 1/2012 | Okuhara | G06F 3/1204 382/295 |
| 2012/0081389 A1* | 4/2012 | Dilts | G06F 3/0486 345/619 |
| 2012/0246596 A1* | 9/2012 | Ording | G06F 9/451 715/799 |
| 2012/0290609 A1 | 11/2012 | Britt | |
| 2012/0293558 A1* | 11/2012 | Dilts | G06F 3/04845 345/676 |
| 2013/0073500 A1* | 3/2013 | Szatmary | G06N 3/105 706/15 |
| 2013/0093787 A1* | 4/2013 | Fulks | G06T 11/206 345/629 |
| 2013/0132895 A1* | 5/2013 | Nemeth | G06T 3/20 715/781 |
| 2013/0151413 A1 | 6/2013 | Sears | |
| 2013/0191775 A1* | 7/2013 | Lawson | G06F 3/0482 715/792 |
| 2013/0227427 A1* | 8/2013 | Mockli | G06F 3/0485 715/747 |
| 2013/0232442 A1* | 9/2013 | Groth | G06F 3/048 715/783 |
| 2013/0328870 A1 | 12/2013 | Grenfell | |
| 2014/0101605 A1* | 4/2014 | Udvardy | G06F 3/04817 715/800 |
| 2014/0132603 A1 | 5/2014 | Raghoebardayal | |
| 2014/0164989 A1* | 6/2014 | Kuh | G06F 3/04842 715/790 |
| 2014/0214825 A1* | 7/2014 | Zhang | G06F 16/9535 707/732 |
| 2014/0317500 A1* | 10/2014 | Kim | G06F 3/016 715/702 |
| 2014/0354650 A1* | 12/2014 | Singh | G06F 8/10 345/440 |
| 2014/0359525 A1* | 12/2014 | Weiner | G06F 3/0485 715/782 |
| 2014/0372894 A1* | 12/2014 | Pandy | G06F 3/0484 715/732 |
| 2015/0106755 A1* | 4/2015 | Moore | G06F 40/106 715/765 |
| 2015/0134095 A1 | 5/2015 | Hemani et al. | |
| 2015/0149314 A1 | 5/2015 | Sears | |
| 2015/0161595 A1 | 6/2015 | Sears | |
| 2015/0279071 A1 | 10/2015 | Xin | |
| 2015/0331968 A1 | 11/2015 | Crocker | |
| 2015/0339379 A1* | 11/2015 | Inagaki | G06F 16/3344 707/776 |
| 2016/0041727 A1* | 2/2016 | Choi | G06T 11/60 715/835 |
| 2016/0103793 A1* | 4/2016 | Fang | G06F 3/0483 715/234 |
| 2016/0216872 A1* | 7/2016 | Dilts | G06F 3/04812 |
| 2016/0261544 A1* | 9/2016 | Conover | H04W 4/08 |
| 2017/0078504 A1* | 3/2017 | Nagata | G09G 5/14 |
| 2017/0116315 A1* | 4/2017 | Xiong | G06F 16/2228 |
| 2017/0371530 A1* | 12/2017 | Vranjes | G06F 9/542 |
| 2018/0048661 A1* | 2/2018 | Bird | G06F 21/57 |
| 2018/0108164 A1* | 4/2018 | Dilts | G06F 16/9558 |
| 2018/0307754 A1* | 10/2018 | Somlai-Fischer | G09G 5/006 |
| 2019/0005115 A1* | 1/2019 | Warner | G16H 50/70 |
| 2019/0163835 A1* | 5/2019 | Scheideler | G06F 16/30 |
| 2019/0258693 A1* | 8/2019 | Lawrence | G06F 17/153 |
| 2019/0311219 A1* | 10/2019 | Alabdulmohsin | G06F 16/285 |
| 2019/0379700 A1* | 12/2019 | Canzanese, Jr. | H04L 41/069 |
| 2020/0137195 A1* | 4/2020 | Lipke | G06F 9/451 |
| 2021/0065424 A1 | 3/2021 | Kniemeyer | |
| 2021/0272327 A1* | 9/2021 | Wang | G06T 1/60 |
| 2021/0286510 A1* | 9/2021 | Tyler | G06F 3/0488 |
| 2021/0286534 A1* | 9/2021 | Mulholland | G06F 3/067 |
| 2022/0068022 A1 | 3/2022 | Kemmler | |
| 2022/0068036 A1* | 3/2022 | Ng | G06T 19/20 |
| 2022/0101065 A1* | 3/2022 | Adeniran | G06F 18/2185 |
| 2022/0179883 A1* | 6/2022 | Biernacki | G06F 16/2246 |
| 2022/0308740 A1* | 9/2022 | Kawano | G06F 3/04845 |

FOREIGN PATENT DOCUMENTS

| | | |
|---|---|---|
| JP | 2008305241 A | 12/2008 |
| WO | WO0139130 A1 | 5/2001 |
| WO | WO2004040576 A1 | 5/2004 |
| WO | WO2009042858 A1 | 4/2009 |
| WO | WO2010034063 A1 | 4/2010 |
| WO | WO2010068175 A2 | 6/2010 |

(56) References Cited

FOREIGN PATENT DOCUMENTS

| WO | WO2010138776 A2 | 12/2010 |
|---|---|---|
| WO | WO2016179401 A1 | 11/2016 |

OTHER PUBLICATIONS

Toklu et al., "Semi-automatic video object segmentation in the presence of occlusion", Jun. 2000, IEEE Transactions on Circuits and Systems for Video Technology, vol. 10, iss. 624-629, 3 pages.
Toklu et al., "Two-dimensional triangular mesh-based mosaicking for object tracking in the presence of occlusion", Jan. 10, 1997, Proc. SPIE, Visual Communications and Image Processing '97, vol. 3024, p. 328-337, 11 pages.
Toklu et al., "Tracking Motion and Intensity Variations Using Hierarchical 2-D Mesh Modeling for Synthetic Object Transfiguration", Nov. 1996, Graphical Models and Image Processing, vol. 58, No. 6, p. 553-573, 21 pages.
Jain et al., "Non-Rigid Spectral Correspondence of Triangle Meshes", Apr. 5, 2007, International Journal of Shape Modeling, 25 pages.
Toklu et al., "2-D mesh-based tracking of deformable objects with occlusion", Sep. 19, 1996, Proceedings of International Conference on Image Processing, 1996, vol. 1, p. 933-936, 3 pages.
Zhao et al., "An object tracking algorithm based on occlusion mesh model", 2002, Proceedings of International Conference on Machine Learning and Cybernetics, 2002, vol. 1, p. 288-292, 3 pages.
Altunbasak et al., "Occlusion-adaptive 2-D mesh tracking", May 10, 1996, Conference Proceedings ICASSP-96, vol. 4, p. 2108-2111.
Tekalp et al., "Face and 2-D mesh animation in MPEG-4", Jan. 2000, Signal Processing: Image Communication, vol. 15, issue 4-5, p. 387-421. https://doi.org/10.1016/S0923-5965(99)00055-7.
Shewchuk, "Triangle: Engineering a 2D quality mesh generator and Delaunay triangulator", 1996, Applied Computational Geometry towards Geometric Engineering Lecture Notes in Computer Science, 1996, vol. 1148, 11 pages.
Dobashi et al., Interactive Rendering method for Displaying Shafts of Light, Proceedings Computer Graphics and Applications; Oct. 2000, pp. 31-37, 435, 3 pages. DOI:10.1109/PCCGA.2000.883864.
Li et al., Unified Volumes for Light Shaft and Shadow with Scattering, 2007 10th IEEE International Conference on Computer-Aided Design and Computer Graphics, Oct. 2007, pp. 161-166.
Akenine-Moller, T., et al., Real-Time Rendering, (Second Edition, A. K. Peters, Ltd., Wellesley, MA), (202), pp. 158, 315-316.
Herndon, K. P., et al., "Interactive Shadows", UIST: Proceedings of the Fifth Annual ACM Symposium on User Interface Software and Technology, (Nov. 15-18, 1992), (1992), 1-6.
Loscos, C., et al., "Real-Time Shadows for Animated Crowds in Virtual Cities", VRST 2001. Proceedings of the ACM Symposium on Virtual Reality Software and Technology, (Nov. 15-17, 2001, Banff, Alberta, Canada), (2001), 85-92.
Woo, A., et al., "A Survey of Shadow Algorithms", IEEE Computer Graphics & Applications, (Nov. 1990), 31 pages.
Bregler, Christoph et al., "Video Rewrite: Driving Visual Speech with Audio", ACM Siggraph 97, Proceedings of the 24th Annual Conference on Computer Graphics and Interactive Techniques, 1997, ISBN: 0-89791-896-7, pp. 1-8.
Haitsma, J. et al., "A Highly Robust Audio Fingerprinting System", IRCAM, 2002, 9 pages.
Held M, Palfrader P. Skeletal structures for modeling generalized chamfers and fillets in the presence of complex miters. Computer-Aided Design and Applications. Jan. 1, 2019;16(4):620-7, 8 pages.
Palfrader, P., Weighted Skeletal Structures in Theory and Practice (Doctoral dissertation, University of Salzburg), 111 pages.
Martin Held et al., 'Straight Skeletons and Mitered Offsets of Polyhedral Terrains in 3D', Computer-Aided Design and Applications, vol. 16, No. 4, 2019, pp. 611-619, Jul. 9, 2018, pp. 611-617.
Gill Barequet et al., 'Straight Skeletons of Three-Dimensional Polyhedra', arXiv:0805.0022v1, Apr. 30, 2008, pp. 1-11.
"Alaric: Euronet Worldwide to implement Alarics Fractals fraud detection solution; Fractals will provide a comprehensive fraud solution for the prevention and detection of fraudulent transactions", M2 Presswire [Coventry],Nov. 7, 2006, pp. 1-2.

* cited by examiner

SYSTEMS AND METHODS FOR A SELF-ADJUSTING NODE WORKSPACE

TECHNICAL FIELD

The present disclosure relates to systems and methods for three-dimensional modeling process enhancement. More particularly, the present disclosure relates to systems and methods for adjusting placement and scaling of nodes in a workspace of a node editor.

BACKGROUND

In three-dimensional (3D) modeling, a node editor allows a user to create an object by routing basic properties through a set of nodes. Each node may perform an operation on the properties, changing how the object will appear visually in 3D space, and may pass the modified properties to the next node. By utilizing various nodes and making appropriate connections between them, desired object appearances can be achieved.

The background description provided herein is for the purpose of generally presenting the context of the disclosure. Unless otherwise indicated herein, the materials described in this section are not prior art and are not admitted to be prior art, or suggestions of the prior art, by inclusion in this section.

SUMMARY OF THE DISCLOSURE

One embodiment provides a computer-implemented method of automatically adjusting a workspace comprising a plurality of nodes for sustained workflow, the method comprising: receiving a new node in the workspace; determining that the new node overlaps with one or more nodes; repositioning a set of nodes within a predetermined distance of the overlap, the set of nodes comprising the new node and the one or more nodes; determining that the new node still overlaps with the one or more nodes; and scaling down the set of nodes until there is no overlap.

One embodiments provides a system comprising: one or more processors; and one or more computer-readable media comprising instructions which, when executed by the one or more processors, cause the one or more processor to perform operations for automatically adjusting a workspace comprising a plurality of nodes for sustained workflow. The operations may comprise: receiving a new node in the workspace; determining that the new node overlaps with one or more nodes; repositioning a set of nodes within a predetermined distance of the overlap, the set of nodes comprising the new node and the one or more nodes; determining that the new node still overlaps with the one or more nodes; and scaling down the set of nodes until there is no overlap.

One embodiment provides one or more non-transitory computer-readable media comprising instructions which, when executed by one or more processors, cause the one or more processors to perform operations for automatically adjusting a workspace comprising a plurality of nodes for sustained workflow. The operations may comprise: receiving a new node in the workspace; determining that the new node overlaps with one or more nodes; repositioning a set of nodes within a predetermined distance of the overlap, the set of nodes comprising the new node and the one or more nodes; determining that the new node still overlaps with the one or more nodes; and scaling down the set of nodes until there is no overlap.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
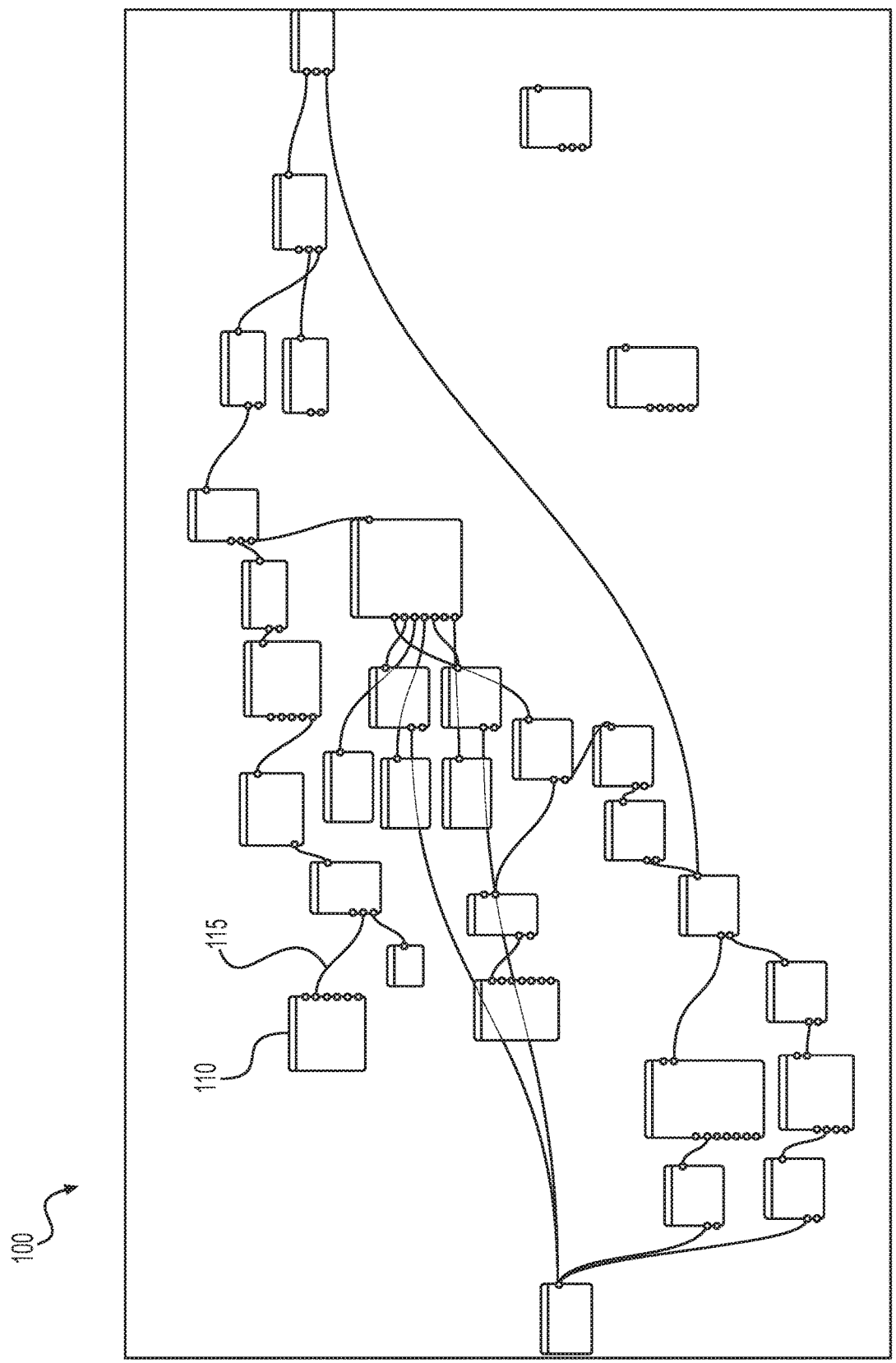
FIG. 1 shows an exemplary workspace of a node editor of a modeling application.

The following embodiments describe systems and methods for 3D modeling process enhancement and, more particularly, for adjusting placement and scaling of nodes in a workspace of a node editor.

3D modeling software allows a user to navigate and inspect objects created in a virtual 3D space and work on small details as well as large scene elements without losing context. A node editor of such 3D modeling software may enable customization of object appearances using nodes and node connections, allowing a user to manipulate object properties to desired specifications. In general, a workspace of a node editor may be composed of i) nodes that represent computations and ii) connections between nodes to control how data flows through the nodes. When creating a complex object or scene, a workspace of the node editor may get clustered with nodes quickly, making visualization and/or addition of nodes more difficult and cumbersome. For instance, the user might have to manually move, group, and/or rescale existing nodes to make room for additional nodes within the workspace.

One solution to this problem is to either arrange existing nodes into node groups or fold the nodes away. Both of these options come with the disadvantage of requiring additional actions from the user to access the nodes again. Further, the node groups or folded areas may not necessarily be created in a logical and/or functional manner, making the resulting layout hard to interpret. Another solution is auto-layouting. This methodology also comes with a disadvantage of destroying the original setup or layout developed by the user, which may lead to a major interruption or confusion in the workflow.

The techniques contemplated in the present disclosure may alleviate or minimize the aforementioned problems. In general, the techniques discussed in the present disclosure provide an automated solution that does not destroy a user's original node layout, by repositioning and/or rescaling nodes based on the current scale and/or size of each node and/or distances from each other in the workspace. In one embodiment, in response to receiving a new node in a workspace, any overlap with existing nodes may be detected. If there is an overlap, a set of nodes within a vicinity of the overlap may be repositioned to even out node distribution around the new node. If there is still an overlap after repositioning, the set of nodes may be scaled down until no overlap exists. Alternatively, the set of nodes may be scaled without an initial repositioning, or the scaling may occur prior to any repositioning. Additionally, a view of the workspace may be adjusted to visually maintain the sizes of the nodes before they were scaled down (i.e., pre-scaling node sizes). By repositioning and/or rescaling nodes, the workspace may be able to hold as many nodes in as small an area as the user is comfortable with. The user may be allowed to zoom in and out of an area of interest within the workspace, for a better view and/or understanding of the node layout.

The subject matter of the present disclosure will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter may be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof. The following detailed description is, therefore, not intended to be taken in a limiting sense.

It should also be noted that all numeric values disclosed herein may have a variation of ±10% (unless a different variation is specified) from the disclosed numeric value. Further, all relative terms such as "about," "substantially," "approximately," etc. are used to indicate a possible variation of ±10% (unless noted otherwise or another variation is specified).

Throughout the specification and claims, terms may have nuanced meanings suggested or implied in context beyond an explicitly stated meaning. Likewise, the phrase "in one embodiment" or "in some embodiments" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Referring now to the appended drawings, FIG. 1 shows an exemplary workspace 100 of a node editor of a modeling application (e.g., a 3D modeling application). Using the node editor, a user may configure various visual properties of an object by creating appropriate nodes (e.g., node 110) and connections (e.g., connection 115) between inputs and outputs of those nodes. As more visual properties are configured and added, the workspace 100 may become cluttered with nodes and connections, making it difficult for the user to interpret the layout and/or place additional nodes in the limited space of the workspace 100. Further, the user may have to adjust the sizes of the existing nodes to make room for any future nodes, as well as the sizes of the nodes being added. The user may also need to place nodes in undesirable locations just to fit all required nodes in the limited space, making interpretation and placement of additional nodes even more cumbersome.

FIGS. 2A-2E illustrate sequential views of an exemplary self-adjusting workspace 200, according to one aspect of the present disclosure. The self-adjusting workspace 200 may be configured to alleviate the problems discussed above. For simplicity and ease of understanding, nodes depicted in FIGS. 2A-2E are illustrated merely as rectangles of varying sizes, and connections between the nodes are not shown. However, one of ordinary skill in the art will recognize that the nodes may be of varying types associated with corresponding operations, and may each include input(s) and/or output(s) enabling connections to and/or from other nodes in the workspace 200.

Figure 2:
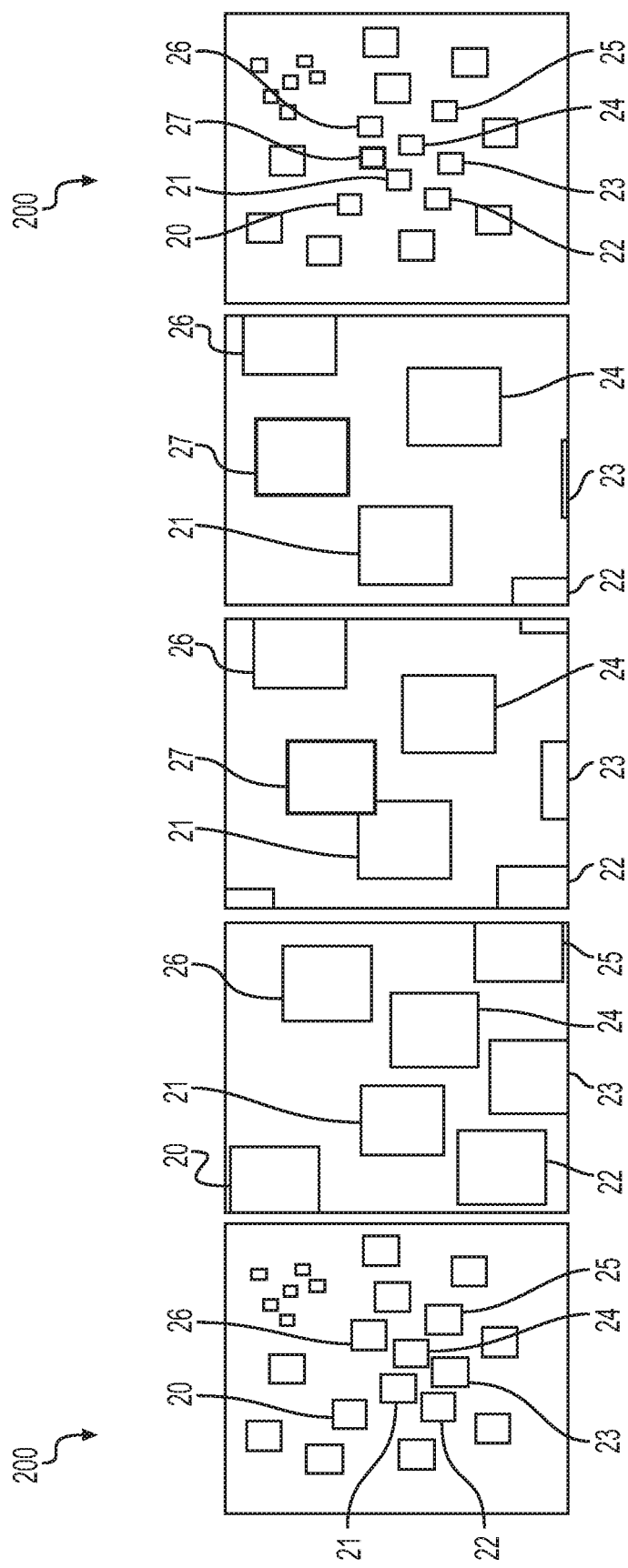
FIGS. 2A-2E illustrate sequential views of an exemplary self-adjusting workspace, according to one aspect of the present disclosure.

FIG. 2A shows a plurality of nodes that are present in the workspace 200, including nodes 20, 21, 22, 23, 24, 25, and 26. The sizes of the nodes may be different or the same. The nodes in FIG. 2A may represent a layout that is unaltered from a user-configured layout, or may represent a layout that has been altered automatically using the techniques of the present disclosure. The workspace 200 in FIG. 2A appears cluttered, making placement of additional nodes by the user at desirable locations difficult and cumbersome.

FIGS. 2B-2D depict partial views of the self-adjusting workspace 200, for the purpose of illustrating operations of the self-adjusting workspace 200 more clearly. FIG. 2B depicts a partial view of the self-adjusting workspace 200 of FIG. 2A prior to a new node being added within the workspace 200. The spaces between the nodes 20, 21, 22, 23, 24, 25, and 26 appear to be limited, which might cause an overlap when a new node is added proximate to any of these existing nodes. FIGS. 2C-2D depict operations of the self-adjusting workspace 200 when such a new node is added in the workspace 200. In FIGS. 2C-2D, in response to a user placing a new node 27 at the cluttered area of the workspace 200, certain existing nodes may be moved from their previous locations to make room for the new node 27.

For example, the nodes 20, 21, 22, 23, 24, 25, and 26 may be repositioned, as illustrated by the changes in node positions from FIG. 2B to FIG. 2C, and from FIG. 2C to FIG. 2D. More specifically, the nodes 20, 21, 22, 23, 24, 25, and/or 26 may be moved or pushed away from the new node 27, in order to make room for the new node 27 and prevent the new node 27 and existing nodes from overlapping with each other. In some embodiments, node movement may be weighted such that closely-grouped nodes maintain their distances between each other, and nodes that are farther away are moved even farther away to provide space for the closely-grouped nodes to be repositioned. Existing node connections (e.g., the number of connections between a new node and an existing node) may also be considered in weighing the degree of movement for a node. From the user's point of view, the nodes may appear to push away from each other and away from where the overlap could have occurred, and even more so when the vicinity of the overlap is more densely populated with nodes (i.e., when a node density is large). In addition to repositioning, or alternatively, all or a subset of the new node 27 and existing nodes 20, 21, 22, 23, 24, 25, and 26 may be rescaled (e.g., scaled down), if an overlap still exists even after repositioning the nodes. In one embodiment, the rescaling may be based on the current scale and/or size of each node within a predetermined distance from the overlap. In some embodiments, the rescaling may be performed using node density (i.e., node weight) information associated with an area surrounding the new node 27 and existing nodes (e.g., an area within a predetermined distance from the overlap).

FIG. 2E depicts the self-adjusting workspace 200 after the nodes are rescaled. In addition to the nodes 20, 21, 22, 23, 24, 25, 26, and 27 being repositioned as explained above in reference to FIGS. 2B-2D, the node may be rescaled (e.g., scaled down) to eliminate further overlap between the nodes. All or a subset of the new node 27 and existing nodes 20, 21, 22, 23, 24, 25, and 26 may be rescaled (e.g., scaled down), if an overlap still exists after repositioning. In one embodiment, the rescaling may be based on the current scale and/or size of each node within a predetermined distance from the overlap. In an alternative or additional embodiment, the rescaling may be performed using node density (i.e., node weight) information associated with an area surrounding the new node 27 and existing nodes (e.g., an area within a predetermined distance from the overlap). For instance, nodes may be rescaled by evaluating a node density associated with a vicinity (i.e., local area that is within a predetermined distance) of the new node 27 or the overlap. In one embodiment, repositioning and/or rescaling of nodes may be performed such that distances between the nodes remain consistent. In another embodiment, distances between the nodes after repositioning and/or rescaling may be substantially proportional to the distances between the nodes prior to repositioning and/or rescaling. The repositioning and rescaling of the nodes will be explained in greater detail below.

Figure 3:
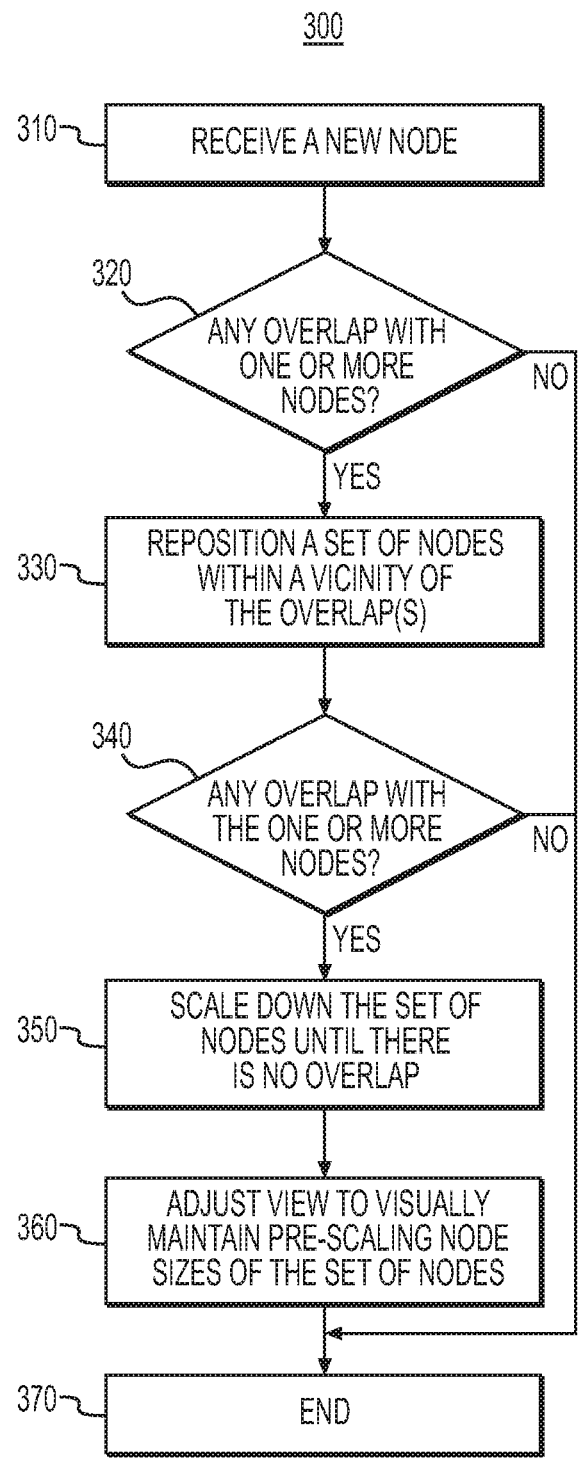
FIG. 3 is a flowchart illustrating an exemplary method of adjusting a workspace of a node editor, according to one aspect of the present disclosure.

FIG. 3 is a flowchart illustrating an exemplary method of adjusting a workspace of a node editor, according to one aspect of the present disclosure. Notably, method 300 may be performed by a modeling application comprising the node editor, to maintain a coherent, interpretable node layout in the workspace. At step 310, the modeling application may receive a new node in a workspace comprising one or more nodes (i.e., one or more existing nodes). For example, the new node may be added to the workspace when a user creates, drags, and drops the new node onto the workspace, or when a user triggers a function leading to creation of a new node. At step 320, the modeling application may determine whether the new node overlaps with one or more nodes in the workspace. If it is determined that the new node does not overlap with any node in the workspace, the method 300 may proceed to step 370 where the workspace adjustment process terminates. On the other hand, if it is determined that the new node overlaps with one or more nodes in the workspace, the method 300 may proceed to step 330.

At step 330, the modeling application may reposition a set of nodes within a vicinity of the overlap(s), in order to eliminate the overlap(s). The set of nodes may comprise the new node and the one or more nodes that overlap with the new node. The set of nodes may further comprise one or more other nodes in the workspace, including nodes that do not overlap with the new node. In general, a vicinity of an overlap may cover the area within close proximity from the detected overlap(s) such as, for example, the area within a predetermined distance from the detected overlap(s). In one embodiment, a vicinity of an overlap may comprise a circular area extending from a center point of the overlap(s). A radius of the circular area may be approximately twice a dimension of the new node, or approximately twice a dimension of a node that overlaps with the new node. The dimension of the new or existing node may be the length of a side of the node, which is usually rectangular-shaped. However, the radius of the circular area may be configured by a developer or an administrator of the modeling application to any specification using dimensions of nodes and/or any overlap(s) in the workspace. For example, a radius of the circular area may be approximately three times a dimension of the new node, or approximately three times a dimension of a node that overlaps with the new node. The set of nodes within the vicinity of the overlap may be repositioned such that the node distribution associated with the vicinity of the overlap is evened out (i.e., a local relaxation technique). In other words, the set of nodes may be moved away (i.e., "relaxed") from the location of the overlap(s). In some embodiments, when the set of nodes in the vicinity of the overlap are pushed away from the overlap, certain nodes outside the vicinity of the overlap may also be pushed away, providing additional space for the set of nodes to be repositioned. In such a case, spaces between clusters of closely-grouped nodes may widen.

In an alternative or additional embodiment, repositioning may be based on the number of connection hops between the new node and each of the one or more nodes that overlap with the new node. The number of connection hops between two nodes may indicate the strength of relationship between the two nodes, or closeness between the two nodes. For example, the more the number of intervening nodes between two nodes, the weaker the relationship between the two nodes. In case of a weaker relationship, the "relaxation" of the node from the new node (i.e., the degree of movement away from the new node) may be more elastic, meaning the node may be pushed farther away from its previous position. In case of a stronger relationship, the "relaxation" of the node from the new node may be less elastic, meaning the node may be moved but may remain relatively close to its previous position. The relaxation technique based on the number of connection hops between nodes may be advantageous in preserving closely-related nodes within close proximity from each other, enabling the user to discern the strength of relationship between nodes based on distances between them and/or the extent of movement away from a new node.

Figure 4A:
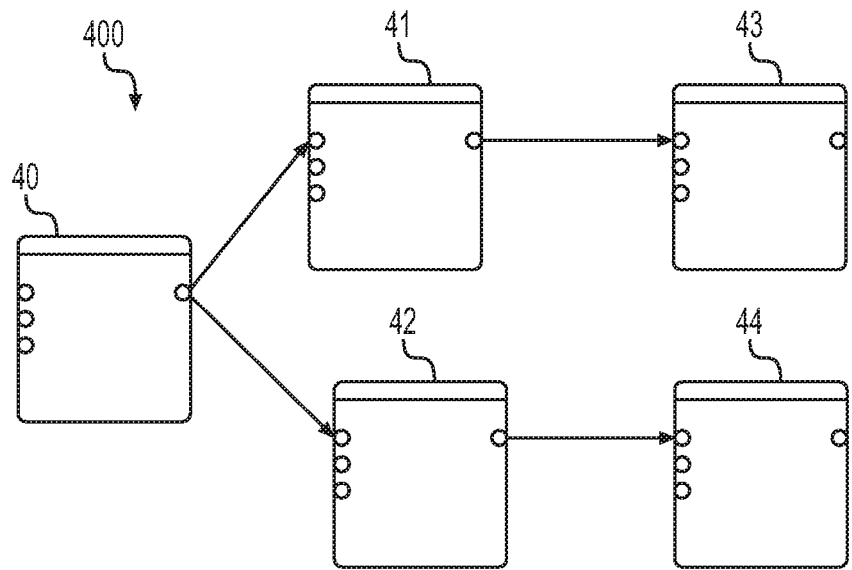
FIGS. 4A-4C illustrate sequential views of an exemplary self-adjusting workspace during repositioning of nodes, according to one aspect of the present disclosure.
Figure 4B:
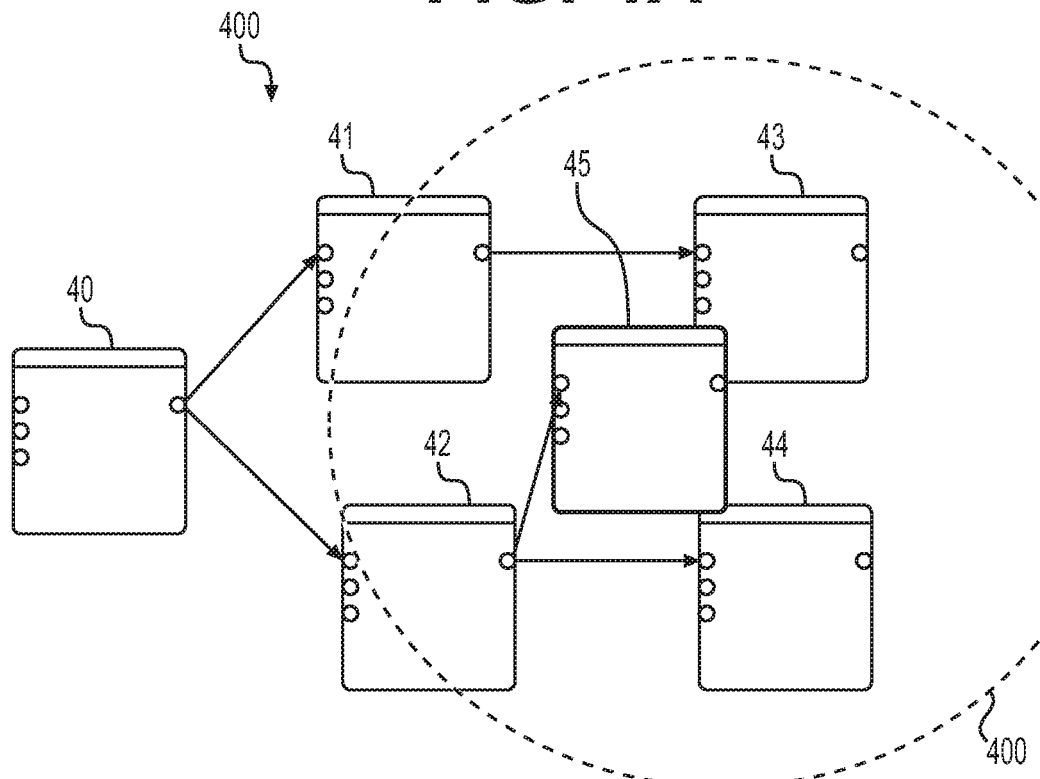
Figure 4C:
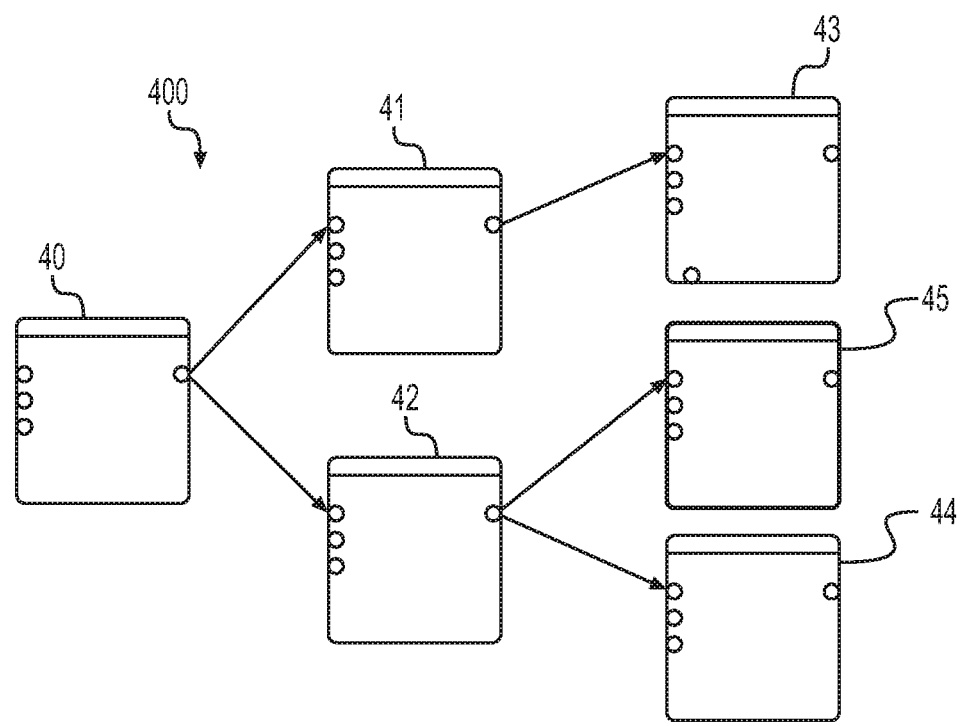

FIGS. 4A-4C illustrate sequential views of an exemplary self-adjusting workspace 400 during repositioning of nodes, according to one aspect of the present disclosure. Notably, the operations illustrated in FIGS. 4A-4C may be performed by a modeling application comprising a node editor, to reposition nodes in response to identifying overlapping nodes in the workspace 400 upon a new node being added. In the example of FIG. 4A, the workspace 400 may initially contain nodes 40, 41, 42, 43, and 44. In FIG. 4B, a new node 45 may be added to the workspace 400. A user might add the new node 45 to a location that does not have enough space for the new node 45, creating an overlap with one or more of the existing nodes 40, 41, 42, 43, and 44. In the example of FIG. 4B, the new node 45 has been inserted at approximately the center point of the surrounding nodes 41, 42, 43, and 44, and the nodes 43 and 44 overlap with the new node 45. The modeling application may detect such an overlap, and may determine a vicinity of the overlap 400 based on the location of the overlap. As explained above, a vicinity of an overlap (e.g., the vicinity of the overlap 400) may comprise a circular area extending from a center point of the overlap, a radius of the circular area being, for example, approximately twice a dimension (e.g., a horizontal side, a vertical side, a diagonal line extending from a top right corner to a bottom left corner, etc.) of a new node (e.g., node 45) or an overlapping node (e.g., node 43, 44, or 45). However, a vicinity of an overlap may be configured to any suitable specification. In FIG. 4B, the vicinity of the overlap 400 completely encloses the new node 45 and the existing nodes 43 and 44, meaning entireties of the new node 45 and the existing nodes 43 and 44 are included within the vicinity of the overlap 400. The nodes that are completely enclosed in the vicinity of the overlap 400 may be part of "a set of nodes" mentioned throughout the present disclosure. Although the set of nodes depicted in FIG. 4B (e.g., nodes 43, 44, and 45) only includes overlapping nodes, the set of nodes may include one or more other nodes that do not overlap with the new node 45, depending on how parameters defining the vicinity of the overlap 500 have been configured by a developer or an administrator of the modeling application.

With continuing reference to FIG. 4B, the set of nodes comprising the new node 45 and the existing nodes 43 and 44 may be repositioned as discussed above in reference to step 330 of the method 300. The repositioned set of nodes are depicted in FIG. 4C.

Alternatively or additionally, the repositioning may consider the number of connection hops between the new node 45 and each of the nodes 43 and 45 that overlap with the new node 45. In FIG. 4B, the number of connection hops between the new node 45 and the node 43 is four, connecting the new node 45 to the node 43 via the intervening nodes 40, 41, and 42. The number of connection hops between the new node 45 and the node 44 is two, connecting the new node 45 to the node 44 via the intervening node 42. Based on the number of connection hops, the modeling application may determine that the connection or relationship between the new node 45 and the node 44 is stronger than the connection or relationship between the new node 45 and the node 43.

As explained above, a node whose connection with a new node is relatively weak may be moved farther away from its previous position, compared to repositioning of a node whose connection with the new node is relatively strong. For example, in FIG. 4C, the node 43 whose connection with the new node 45 is relatively weak has been moved farther away from its previous position shown in FIGS. 4A-4B, and the node 44 whose connection is relatively strong has been slightly moved from its previous position shown in FIGS. 4A-4B. It should be noted that a new node may also be repositioned from its initial location (e.g., the position at which the new node was dragged and dropped onto the workspace by a user, the position at which the new node was created in response to a user activating a function within the node editor, etc.). For example, in FIGS. 4B-4C, the new node 45 has been moved from its initial position shown in FIG. 4B to the position shown in FIG. 4C.

Figure 5A:
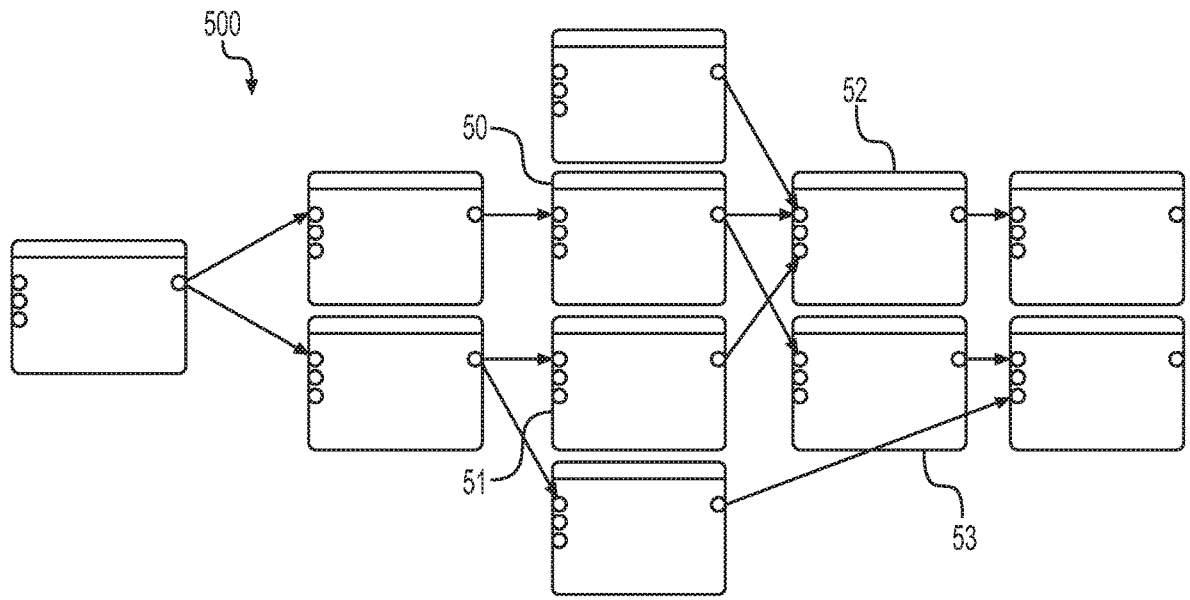
FIGS. 5A-5C illustrate sequential views of an exemplary self-adjusting workspace, in which overlaps between nodes remain after repositioning.
Figure 5B:
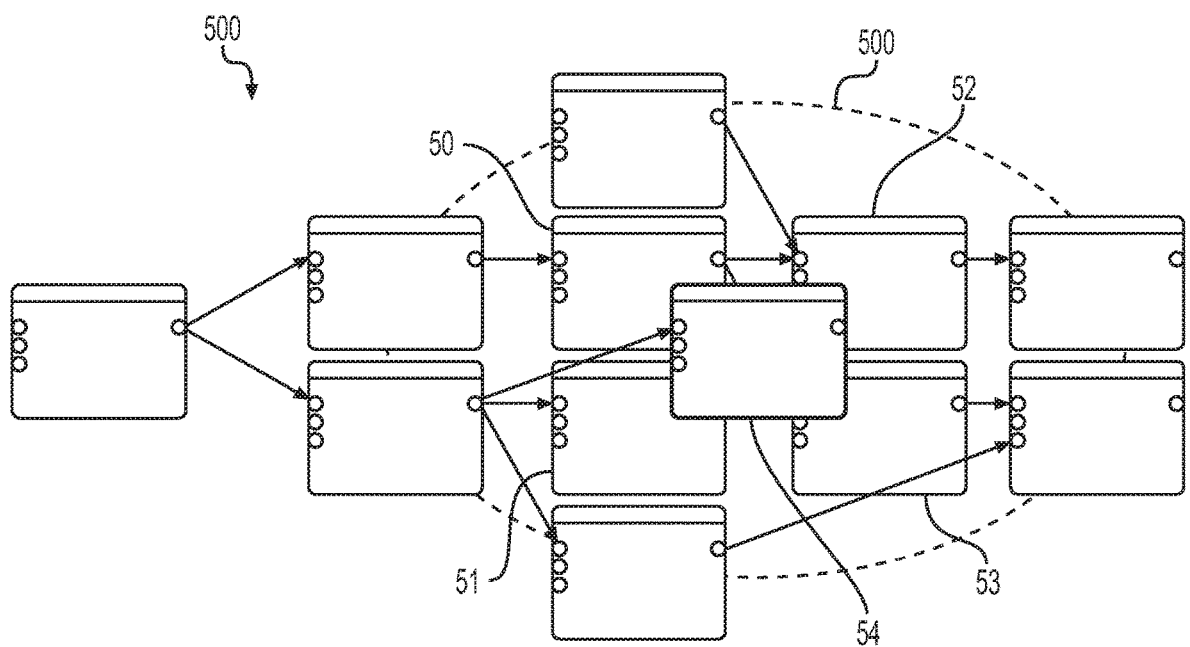
Figure 5C:
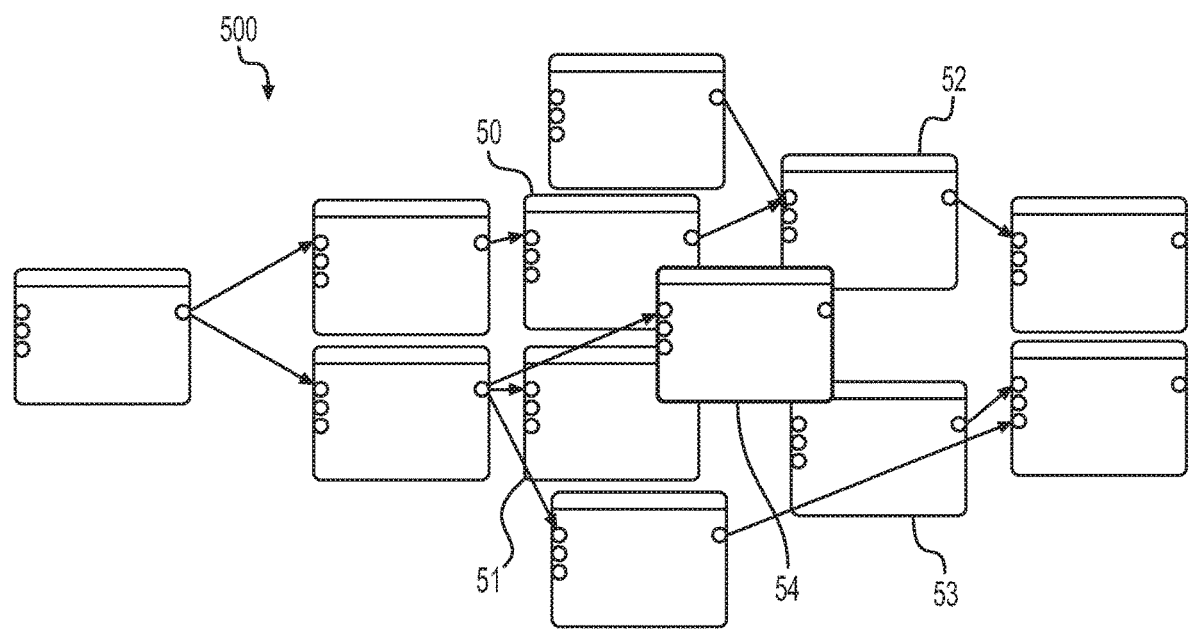

With renewed reference to FIG. 3, at step 340, the modeling application may determine whether the new node still overlaps with the one or more nodes in the workspace, even after repositioning the set of nodes at step 330. If it is determined that the new node no longer overlaps with the one or more nodes, the method 300 may proceed to step 370 where the workspace adjustment process terminates. On the other hand, if it is determined that the new node still overlaps with the one or more nodes, the method 300 may proceed to step 350. As an example, FIGS. 5A-5C illustrate sequential views of an exemplary self-adjusting workspace 500, in which overlaps between multiple nodes still exist after repositioning. In FIG. 5A, the workspace 500 may initially contain multiple nodes, including nodes 50, 51, 52, and 53. Subsequently, a new node 54 may be added to the workspace 500 as shown in FIG. 5B. A user might add the new node 54 to a location that does not have enough space for the new node 54, creating an overlap with one or more of the existing nodes 50, 51, 52, and 53. The modeling application may detect the overlap(s), and may reposition the nodes based on node distribution and/or the number of connection hops between the new node 54 and each of the overlapping existing nodes 50, 51, 52, and 53. The repositioned nodes 50, 51, 52, and 53 are depicted in FIG. 5C. As shown in FIG. 5C, repositioning of the nodes might not completely eliminate the overlap(s) in the workspace 500. In such a case, the modeling application may perform additional operations to eliminate the overlap(s), such as by rescaling or scaling down certain nodes in the workspace 500. The rescaling operation is explained in greater detail below.

Referring back to FIG. 3, at step 350, the modeling application may scale down (i.e., rescale) the set of nodes until there is no overlap. As explained above, the set of nodes may comprise the one or more nodes that overlap with the new node, as well as the new node that is added to the workspace. The set of nodes may further comprise one or more other nodes that do not overlap with the new node. In general, the set of nodes may be scaled down to the point where no overlap occurs between the nodes, and such rescaling may be performed based on the current scale and/or size of each node within a predetermined distance of the overlap. Parameters defining the local area in which the nodes to be rescaled are positioned may be configured by a developer or an administrator of the modeling application. In some embodiments, a pair of nodes may still be considered to be overlapping when the rectangular windows of the nodes merely "touch" each other, meaning the nodes are placed exactly adjacent to each other and one node does not necessarily obscure a portion of the other node. In such a case, the set of nodes may be scaled down do the point where a certain distance or gap is achieved between the nodes, to allow for connections between the nodes to be readily recognizable by clearing the area immediately outside the periphery of each node. The exact distance or the amount/size of the gap required between two nodes, to be considered non-overlapping, may depend on dimensions of various graphical user interface (GUI) elements used in the node editor.

Figure 7A:
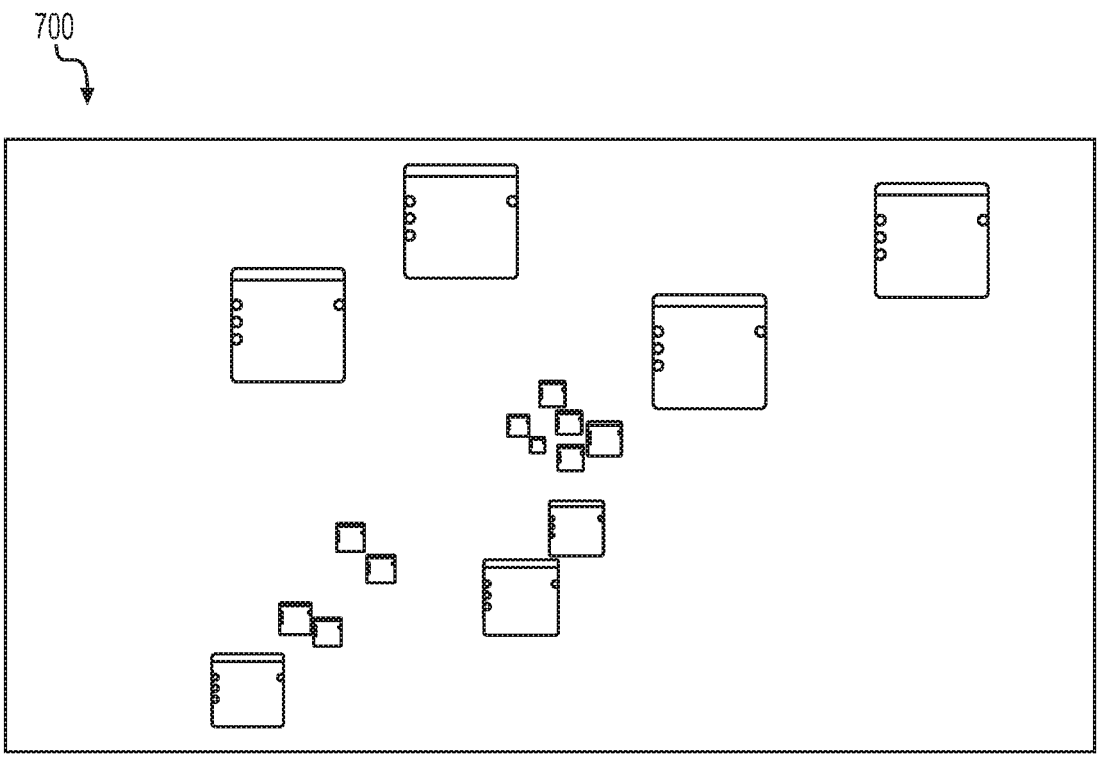
FIG. 7A shows an exemplary self-adjusting workspace including a plurality of nodes, according to one aspect of the present disclosure.
Figure 7B:
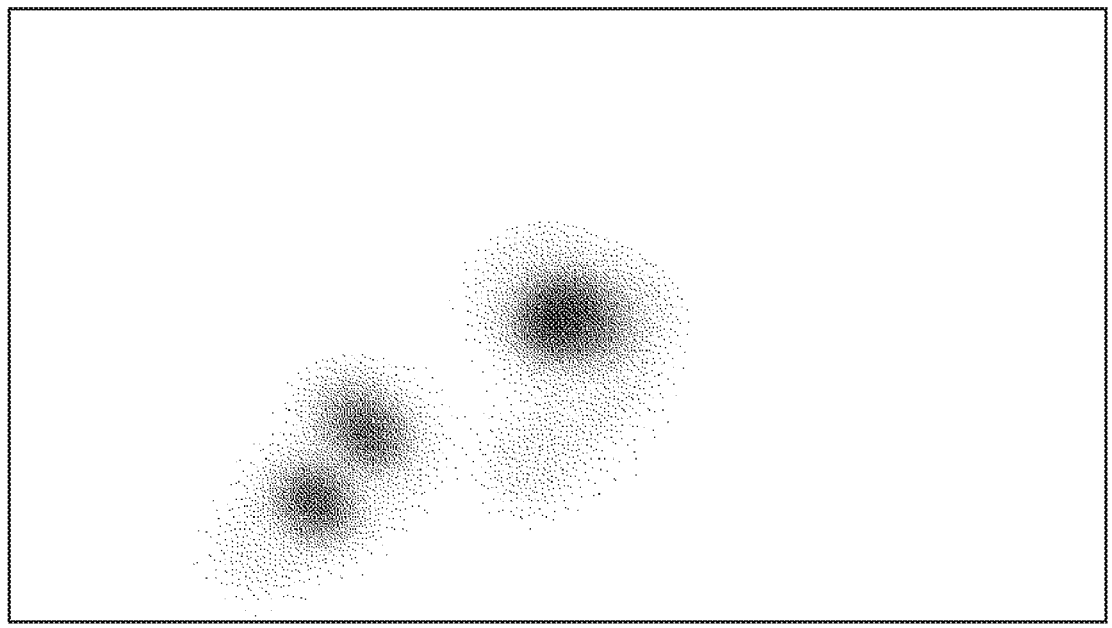
FIG. 7B shows a node density map that corresponds to the self-adjusting workspace of FIG. 7A.

In an alternative or additional embodiment, the set of nodes may be rescaled based on a node density map of the workspace. A node density map may be generated based on the location and density/weight of each node included in the workspace. The effective density or weight of a node may be calculated based on its size and current scale. Each node may thus add a fraction to the total density/weight associated with the workspace, or a portion of the workspace. FIG. 7A shows an exemplary self-adjusting workspace 700 including a plurality of nodes, and FIG. 7B shows a node density map that corresponds to the workspace 700 shown in FIG. 7A. In areas where nodes are densely populated, which may be identified from the node density map, the nodes may be scaled down to relatively smaller sizes compared to areas where nodes are more sparsely populated or scattered. In general, the scale or the size of a node may be inversely proportional to the node density or weight associated with the local area surrounding the node (e.g., a vicinity of an overlap, an area within a predetermined distance from the node/overlap). Parameters defining the local area of a node may be configured by a developer or an administrator of the modeling application.

It should be noted that, the area enclosing the nodes to be repositioned may be within a first predetermined distance from the point of overlap detected at step 320, and the area enclosing the nodes to be rescaled may be within a second predetermined distance from the point of overlap detected at step 340. In one embodiment, the first predetermined distance and the second predetermined distance may be the same. In other embodiments, the first predetermined distance and the second predetermined distance may be different. As explained above, a developer or an administrator may configure parameters defining the area in which the nodes to be repositioned or rescaled exist.

Figure 6A:
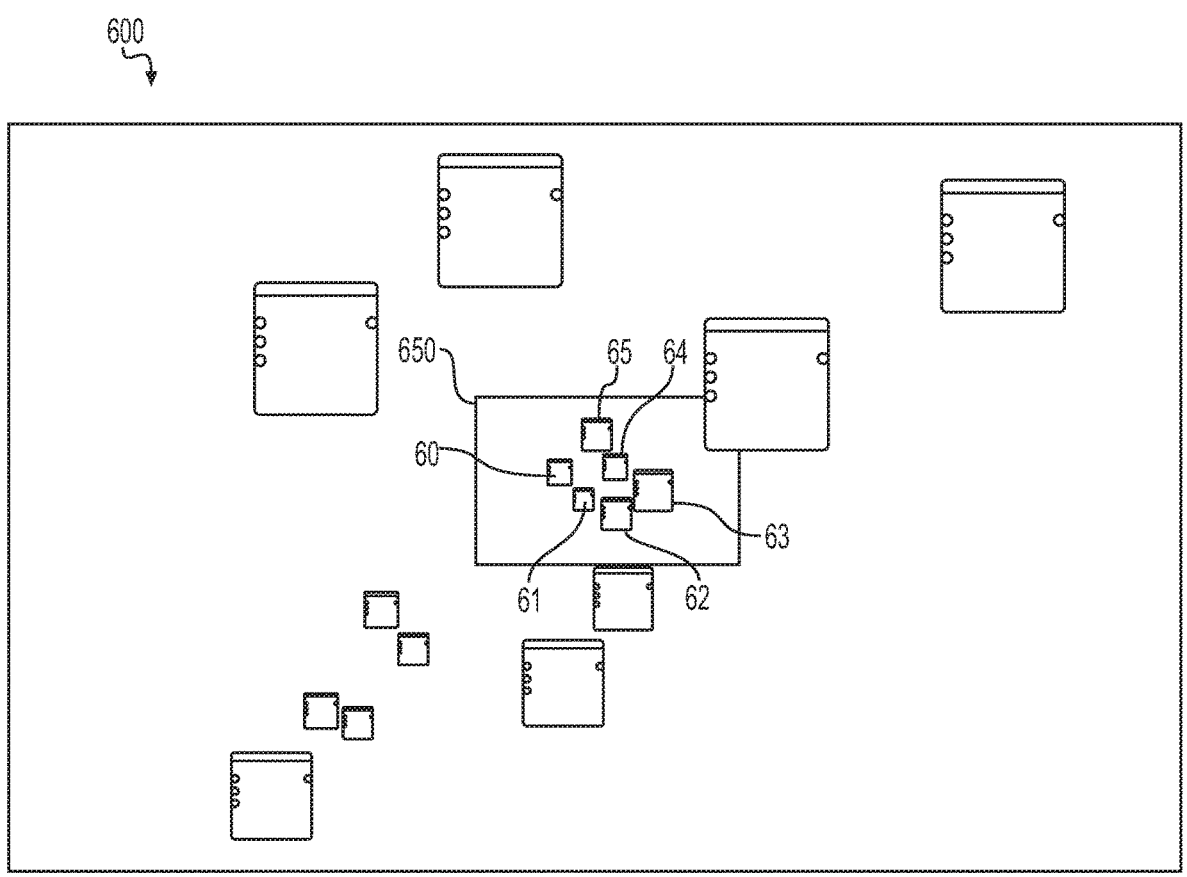
FIG. 6A shows an exemplary self-adjusting workspace, when a view of the workspace is panned out to show all nodes, according to one aspect of the present disclosure.
Figure 6B:
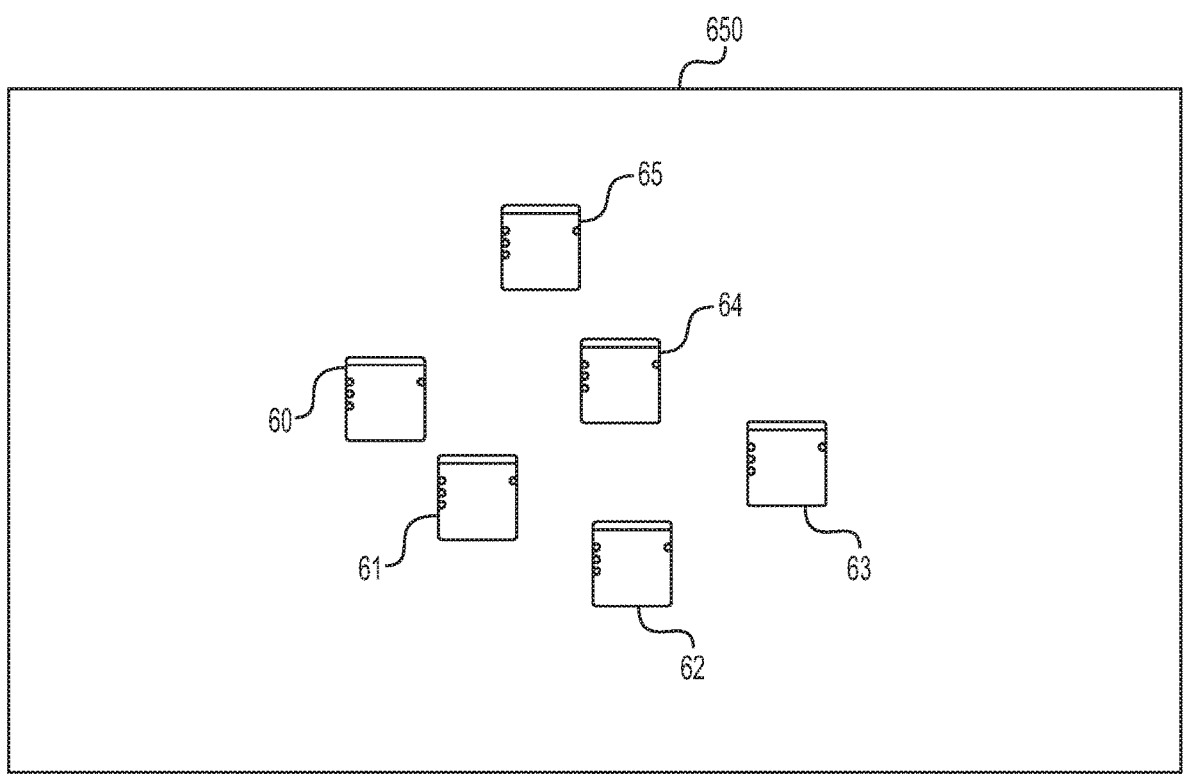
FIG. 6B shows an adjusted view of the exemplary self-adjusting workspace of FIG. 6A, according to one aspect of the present disclosure.

To prevent differences in node scale while using the node editor, which might irritate the end user, the modeling application may adjust scaling as the user pans to have the nodes in the user's field of view at the same scale. In one embodiment, the action of scaling nodes to the same scale may be performed by the modeling application in response to determining that the workspace is being scrolled by the user (i.e., in response to the user zooming in on a particular area of the workspace). In some embodiments, the actions of panning (e.g., zooming in) and scaling nodes to the same sale may be performed automatically by the modeling application. As an example, FIG. 6A shows an exemplary self-adjusting workspace 600, when a view of the workspace is panned out to show all nodes. Notably, when the view is completely panned out, the nodes may be shown at their true scales, all or some of which may be representative of any adjustment made upon a new node being added to the workspace. However, the user might only be interested in a subset of the nodes at a particular point in time, the subset of nodes being in close proximity to a new node or any node that the user might be interested in. For example, upon the user adding the node 64, the user might be interested in the surrounding nodes 60, 61, 62, 63, and 65, as one or more of those nodes are likely to be connected to the new node 64. Therefore, the modeling application may be configured to adjust the view to zoom in on the nodes 60, 61, 62, 63, 64, and 65, upon the new node 64 being added to the workspace and the nodes in proximity to the new node 64 being rescaled. The area containing the nodes 60, 61, 62, 63, 64, and 65 to which the view may be adjusted is shown as an area of interest 650 in FIG. 6A. FIG. 6B shows an adjusted view of the exemplary self-adjusting workspace 600 upon, for example, a new node being added. As explained above, the modeling application may adjust the view to zoom in on the area of interest 650 containing nodes 60, 61, 62, 63, 64, and 65. In addition to zooming in, the modeling application may also adjust the sizes of the nodes 60, 61, 62, 63, 64, and 65 to their pre-scaling sizes, in order maintain the nodes at a same scale for user convenience and improved workflow. The nodes 60, 61, 62, 63, 64, and 65 are thus shown at the same scale in the adjusted view illustrated in FIG. 6B. If the user wants to view or work on nodes positioned outside the area of interest 650, the user may be able to pan out to see the entire workspace 600, or a portion of the workspace 600 that is larger than the area of interest 650, either of which may show the nodes at their true scales depending on a pre-defined specification.

With renewed reference to FIG. 3, to maintain nodes that the user might be interested in at the same scale as explained above in reference to FIGS. 6A-6B, once the set of nodes are scaled down at step 350, the modeling application may adjust a view of the workspace to visually maintain pre-scaling sizes of the set of nodes at step 360. The view may be adjusted by zooming in on the nodes that are in close proximity to the new node, which may be the area of interest to the user. Parameters defining the degree to which the view is zoomed in, or the area of interest to which the view is adjusted, may be configured by a developer or an administrator of the modeling application. When the view is adjusted, the nodes visible within the adjusted view may also be adjusted to their pre-scaling node sizes. In one embodiment, the adjusted view may cover the vicinity of the overlap determined at step 330. In other embodiments, the adjusted view may cover an area larger than the vicinity of the overlap, or an area smaller than the vicinity of the overlap. Therefore, the adjusted view may include nodes that are outside the vicinity of the overlap, and the nodes outside the vicinity of the overlap may also be scaled back to their pre-scaling node sizes. The pre-scaling node size of a node may be determined based on a multiplicative inverse of the scale change at step 350. If the user wants to view or work on nodes positioned outside the area of interest represented by the adjusted view, the user may be able to pan out to see the entire workspace, or a portion of the workspace that is larger than the area of interest, either of which may show the nodes at their true scales.

Embodiments of the present disclosure and all of the functional operations described in this specification can be implemented in digital electronic circuitry, or in computer software, firmware, or hardware, including the structures disclosed in this specification and their structural equivalents, or in combinations of one or more of them. Embodiments of the present disclosure can be implemented as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the present disclosure can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the present disclosure can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the present disclosure, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the present disclosure or of what may be claimed, but rather as descriptions of features specific to particular embodiments of the present disclosure. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A computer-implemented method of automatically adjusting a workspace comprising a plurality of nodes for sustained workflow, the method comprising:
   receiving a new node in the workspace;
   determining that the new node overlaps with one or more nodes;
   repositioning a set of nodes within a predetermined distance of the overlap, the set of nodes comprising the new node and the one or more nodes;
   determining that the new node still overlaps with the one or more nodes;
   determining a weight for each node within a second predetermined distance of the overlap;
   scaling down each node in the set of nodes based on the weight until there is no overlap, and adjusting a view of the workspace to visually maintain a pre-scaling relative node size of each of the new node and the one or more nodes.

2. The computer-implemented method of claim 1, wherein the set of nodes further comprises one or more other nodes.

3. The computer-implemented method of claim 1, wherein the workspace comprises a workspace of a node editor of an object modeling application.

4. The computer-implemented method of claim 1, wherein each of the plurality of nodes is associated with one or more properties of an object.

5. The computer-implemented method of claim 1, wherein the repositioning is based at least in part on distances between the set of nodes.

6. The computer-implemented method of claim 1, wherein the repositioning is based at least in part on a number of connection hops between the new node and each of the one or more nodes.

7. The computer-implemented method of claim 1, wherein the scaling further comprises:
determining a size of each node within the second predetermined distance of the overlap; and
scaling based on the size of each node within the second predetermined distance of the overlap.

8. The computer-implemented method of claim 1, wherein the predetermined distance of the overlap comprises a circular area extending from a center point of the overlap, a radius of the circular area being at least twice the dimension of at least one of the new node and the one or more nodes.

9. The computer-implemented method of claim 1, further comprising:
determining that the workspace is being scrolled; and
in response to determining that the workspace is being scrolled, adjusting a view of the workspace to visually maintain pre-scaling sizes of the set of nodes, wherein the pre-scaling sizes are sizes of the set of nodes prior to being scaled down.

10. The computer-implemented method of claim 9, wherein the adjusting comprises:
zooming in on an area of interest; and
displaying the set of nodes at the pre-scaling sizes.

11. The computer-implemented method of claim 1, wherein the weight of nodes is based on a density map.

12. A system comprising:
one or more processors;
one or more non-transitory processor readable storage devices comprising instructions which, when executed by the one or more processors, cause the one or more processor to perform operations for automatically adjusting a workspace comprising a plurality of nodes for sustained workflow, the operations comprising:
receiving a new node in the workspace;
determining that the new node overlaps with one or more nodes;
repositioning a set of nodes within a predetermined distance of the overlap, the set of nodes comprising the new node and the one or more nodes;
determining that the new node still overlaps with the one or more nodes;
determining a weight of each node within a second predetermined distance of the overlap;
scaling down the set of nodes based on the weight until there is no overlap, and
adjusting a view of the workspace to visually maintain a pre-scaling relative node size of each of the new node and the one or more nodes.

13. The system of claim 12, wherein the set of nodes further comprises one or more other nodes.

14. The system of claim 12, wherein the workspace comprises a workspace of a node editor of an object modeling application.

15. The system of claim 12, wherein the repositioning is based at least in part on distances between the set of nodes.

16. The system of claim 12, wherein the repositioning is based at least in part on a number of connection hops between the new node and each of the one or more nodes.

17. The system of claim 12, wherein the scaling further comprises:
determining a size of each node within second predetermined distance of the overlap; and
scaling based on the size of each node within the second predetermined distance of the overlap.

18. The system of claim 12, wherein the predetermined distance of the overlap comprises a circular area extending from a center point of the overlap, a radius of the circular area being at least twice the dimension of at least one of the new node and the one or more nodes.

19. The system of claim 12, the operations further comprising:
adjusting a view of the workspace to visually maintain pre-scaling sizes of the set of nodes, wherein the pre-scaling sizes are sizes of the set of nodes prior to being scaled down.

20. The system of claim 19, wherein the adjusting comprises:
zooming in on an area of interest; and
displaying the set of nodes at the pre-scaling sizes.

21. One or more non-transitory computer-readable media comprising instructions which, when executed by one or more processors, cause the one or more processors to perform operations for automatically adjusting a workspace comprising a plurality of nodes for sustained workflow, the operations comprising:
receiving a new node in the workspace;
determining that the new node overlaps with one or more nodes;
repositioning a set of nodes within a predetermined distance of the overlap, the set of nodes comprising the new node and the one or more nodes;
determining that the new node still overlaps with the one or more nodes;
determining a weight of each node within a second predetermined distance of the overlap;
scaling down the set of nodes based on the weight until there is no overlap, and
adjusting a view of the workspace to visually maintain a pre-scaling relative node size of each of the set of nodes.

* * * * *